(12) United States Patent
Tsai et al.

(10) Patent No.: US 9,084,368 B2
(45) Date of Patent: Jul. 14, 2015

(54) SINGLE FPC BOARD FOR CONNECTING MULTIPLE MODULES AND TOUCH SENSITIVE DISPLAY MODULE USING THE SAME

(75) Inventors: Jiun-Jie Tsai, Hsinchu (TW); Ching-Chun Lin, New Taipei (TW); Tsen-Wei Chang, Taichung (TW); Yu-Tsung Lu, Hsinchu (TW); Tzu-Jen Lo, Hsinchu (TW); Hao-Jan Huang, Hsinchu (TW); Wing-Kai Tang, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 80 days.

(21) Appl. No.: 13/438,636

(22) Filed: Apr. 3, 2012

(65) Prior Publication Data

US 2012/0319967 A1 Dec. 20, 2012

Related U.S. Application Data

(60) Provisional application No. 61/497,505, filed on Jun. 15, 2011.

(30) Foreign Application Priority Data

Aug. 17, 2011 (TW) .............................. 100129439 A

(51) Int. Cl.
G06F 3/041 (2006.01)
H05K 1/02 (2006.01)
(Continued)

(52) U.S. Cl.
CPC .............. *H05K 1/189* (2013.01); *G06F 1/1626* (2013.01); *G06F 1/184* (2013.01); *G06F 1/185* (2013.01);
(Continued)

(58) Field of Classification Search
CPC ....... H05K 1/189; H05K 1/147; H05K 1/058; H05K 2201/052; H05K 2201/10128; H05K 2201/10151; H05K 2201/10166; G06F 3/041; G06F 3/0412; G06F 2203/04102; G06F 1/1626; G06F 1/184; G06F 1/185
USPC ......... 345/173–174; 178/18.01, 18.05–18.07; 174/250, 254–255, 378, 117 F; 361/679.01, 748, 803, 760; 349/149–150, 152; 257/E23.177, 257/E23.065; 439/67, 77, 630
See application file for complete search history.

(56) References Cited

U.S. PATENT DOCUMENTS 6,044,708 A * 4/2000 Hirosawa .................... 73/504.15
6,549,419 B1 * 4/2003 Nakano et al. ................ 361/749
(Continued)

FOREIGN PATENT DOCUMENTS

CN 100353472 C 12/2007
CN 101231405 A 7/2008
(Continued)

OTHER PUBLICATIONS

Office Action issued by Taiwan Intellectual Property Office on Feb. 17, 2014.
(Continued)

*Primary Examiner* — Lun-Yi Lao
*Assistant Examiner* — Elliott Deaderick
(74) *Attorney, Agent, or Firm* — Rabin & Berdo, P.C.

(57) ABSTRACT

A single flexible printed circuit (FPC) board for connecting multiple modules including a thin film is provided. The thin film has a first module connecting portion, a second module connecting portion and a third module connecting portion. The first module connecting portion is located on a first side of the thin film. The second module connecting portion and the third module connecting portion are located on a second side of the thin film. The first side is opposite to the second side. At least one first line is disposed between the first module connecting portion and the second module connecting portion. At least one second line is disposed between the first module connecting portion and the third module connecting portion.

14 Claims, 10 Drawing Sheets

(51) Int. Cl.
*H05K 1/18* (2006.01)
*G06F 1/16* (2006.01)
*G06F 1/18* (2006.01)
*H05K 1/14* (2006.01)

(52) U.S. Cl.
CPC .............. *G06F 3/041* (2013.01); *G06F 3/0412* (2013.01); *H05K 1/028* (2013.01); *G06F 2203/04102* (2013.01); *H05K 1/147* (2013.01); *H05K 2201/052* (2013.01); *H05K 2201/10128* (2013.01); *H05K 2201/10151* (2013.01); *H05K 2201/10166* (2013.01)

(56) References Cited

U.S. PATENT DOCUMENTS

| | | | | |
|---|---|---|---|---|
| 7,108,515 | B2 * | 9/2006 | Tanabe et al. | 439/67 |
| 7,455,529 | B2 * | 11/2008 | Fujii et al. | 439/67 |
| 7,529,100 | B2 * | 5/2009 | Chuang et al. | 361/749 |
| 7,948,762 | B2 * | 5/2011 | Castillo Garcia et al. | 361/749 |
| 2002/0149914 | A1 * | 10/2002 | Karasawa et al. | 361/749 |
| 2005/0047776 | A1 * | 3/2005 | Watanabe et al. | 396/543 |
| 2005/0219230 | A1 * | 10/2005 | Nakayama et al. | 345/173 |
| 2008/0180585 | A1 * | 7/2008 | Kubota et al. | 349/12 |
| 2009/0194342 | A1 * | 8/2009 | Kuo et al. | 178/18.03 |
| 2009/0213089 | A1 * | 8/2009 | Hwang et al. | 345/174 |
| 2009/0284937 | A1 * | 11/2009 | Rytky | 361/749 |
| 2010/0016039 | A1 * | 1/2010 | Tokuyama | 455/575.3 |
| 2010/0045192 | A1 * | 2/2010 | Lee et al. | 315/152 |
| 2010/0122837 | A1 * | 5/2010 | Motsch et al. | 174/250 |
| 2010/0331060 | A1 * | 12/2010 | Yoshida | 455/575.1 |
| 2011/0132642 | A1 * | 6/2011 | Shinoda et al. | 174/254 |

FOREIGN PATENT DOCUMENTS

| | | |
|---|---|---|
| CN | 100541403 C | 9/2009 |
| TW | 555211 | 9/2003 |
| TW | M381945 | 6/2010 |
| TW | M399404 U | 3/2011 |

OTHER PUBLICATIONS

Chinese Office Action issued on Jun. 10, 2014.
Chinese Office Action dated Apr. 13, 2015.

* cited by examiner

SINGLE FPC BOARD FOR CONNECTING MULTIPLE MODULES AND TOUCH SENSITIVE DISPLAY MODULE USING THE SAME

This application claims the benefits of U.S. provisional application Ser. No. 61/497,505, filed Jun. 15, 2011 and Taiwan application Serial No. 100129439, filed Aug. 17, 2011, the subject matters of which are incorporated herein by reference.

BACKGROUND OF THE INVENTION

1. Field of the Invention

The invention relates in general to a flexible printed circuit (FPC) board, and more particularly to a single FPC board for connecting multiple modules and a touch sensitive display module using the same.

2. Description of the Related Art

Touch panels have now been widely used in various electronic products. Particularly, most display panels are equipped with a touch panel for allowing users to click or press the screen with a finger or a stylus. For example, the resistive touch panel detects the coordinates of the touch point by sensing voltage drop, and the capacitive touch panel calculates the coordinates of the touch point by forming a uniform electrical field on the panel and sensing the current of the touch point. Then, the coordinates of the touch point are processed through a FPC board and a control circuit so as to generate an image on the display panel and to provide a more convenient and user-friendly operating interface for the user.

Referring to FIGS. 1 and 2, a schematic diagram and an assembly structural diagram of a conventional touch sensitive display module are respectively shown. The touch sensitive display module 100 is formed by a display panel 110, a touch panel 120 and a motherboard 130. The display panel 110 has a first FPC board 142 and a connector 144. The touch panel 120 has a second FPC board 140. A cover 150 covers the touch panel 120 disposed on the display panel 110, and the touch panel 120 and the display panel 110 can be bonded together with a bonding adhesive. During assembly, after the second FPC board 140 is connected to the first FPC board 142 through the connector 144, the first FPC board 142 is electrically connected to the motherboard 130 through the connector 132 on the motherboard 130.

In the above assembly structure, two FPC boards 140 and 142 are used and are connected through a connector 144, and more assembly hours and a larger space are required for assembling the two FPC boards. Since two FPC boards are used, more cost will be incurred and more wastes will be generated in the manufacturing process.

SUMMARY OF THE INVENTION

The disclosure is directed to a single FPC board for connecting multiple modules and a touch sensitive display module using the same. The disclosure allows reduction of the assembly hours of multiple modules and the assembly space of the FPC board. In addition, the discourse can be conformed to the thinning requirement. Moreover, the FPC board can be formed by a single thin film, hence incurring lower cost and generating fewer wastes in the manufacturing process.

According to an aspect of the present invention, a single FPC board for connecting multiple modules including a thin film, at least one first line and at least one second line is provided. The thin film has a first module connecting portion, a second module connecting portion and a third module connecting portion. At least one first line is disposed between the first module connecting portion and the second module connecting portion. At least one second line is disposed between the first module connecting portion and the third module connecting portion.

According to another aspect of the present invention, a touch sensitive display module including a first module, a second module, a third module and a single FPC board is provided. The second module is disposed on the first module. The third module is adjacent to the first module located between the second module and the third module. The single FPC board connects the first module, the second module and the third module.

The above and other aspects of the invention will become better understood with regard to the following detailed description of the preferred but non-limiting embodiment(s). The following description is made with reference to the accompanying drawings.

DETAILED DESCRIPTION OF THE INVENTION

The single FPC board for connecting multiple modules of a present embodiment adopts a single thin film design for connecting three or more modules, such as a display panel, a touch panel and a motherboard for transmitting relevant electrical signals. In one embodiment, a folding connection design of the single FPC board enables the lines on the thin film to be electrically connected between the display panel and the touch panel. In another embodiment, a design of branch connection of the single FPC board enables the lines on the thin film to be electrically connected between the display panel and the touch panel. Thus, the lines on the thin film can be electrically connected between the display panel and the touch panel through one FPC board without using an extra connector, so that the time for assembling the multiple modules and the space for assembling the FPC board can be reduced and the thinning requirement can be satisfied.

The invention is elaborated below with the exemplification of a touch sensitive display module. However, the embodiments below are for exemplification purpose only, not for limiting the scope of protection of the invention.

First Embodiment

Figure 1:
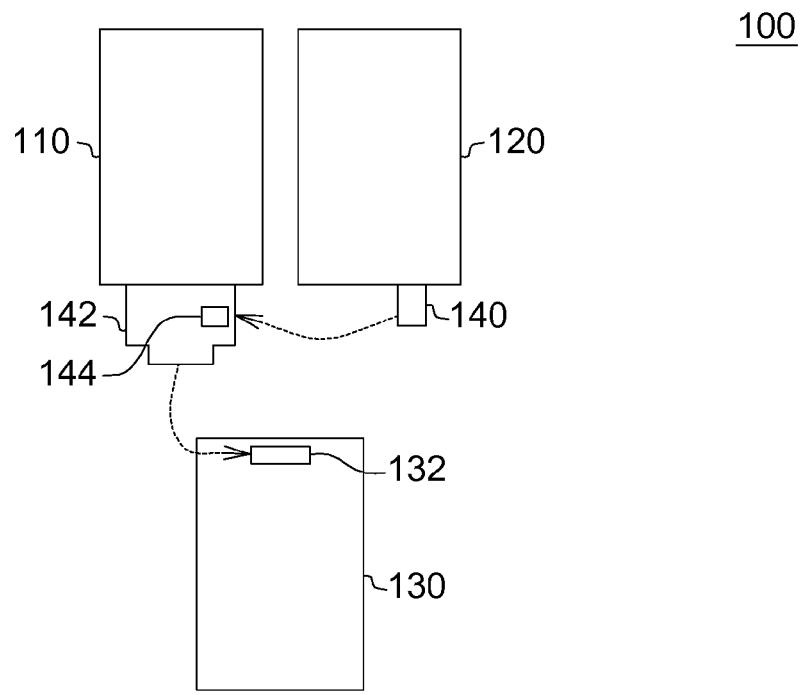
FIGS. 1 and 2 respectively show a schematic diagram and an assembly structural diagram of a conventional touch sensitive display module.
Figure 2:
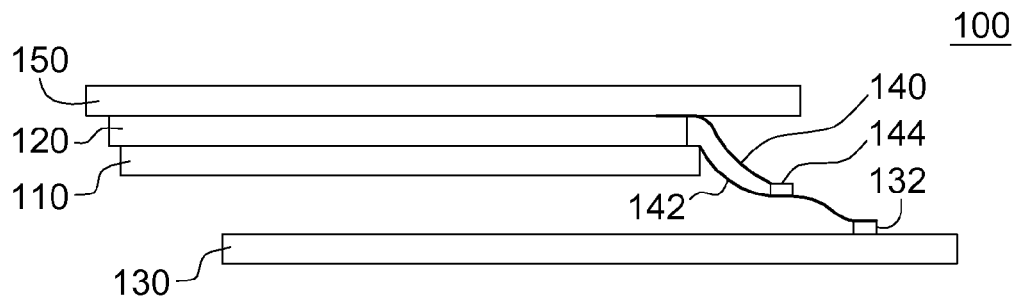
Figure 3A:
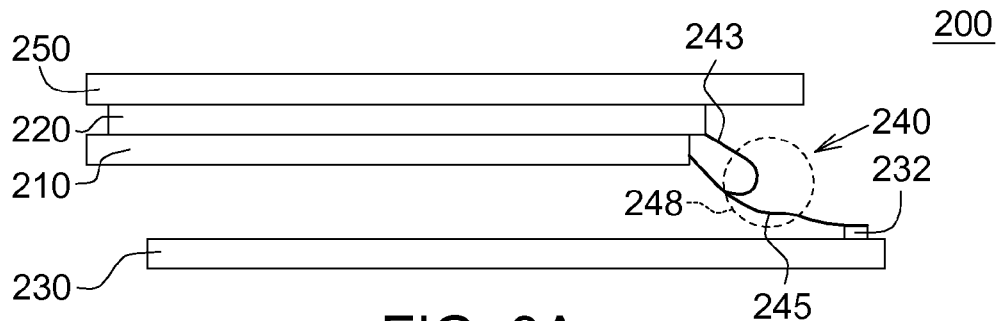
FIGS. 3A~3C show assembly structural diagrams of a touch sensitive display module according to one embodiment of the invention.
Figure 3B:
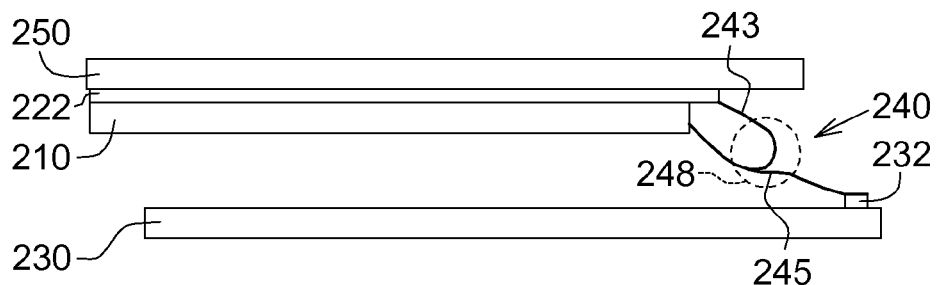
Figure 3C:
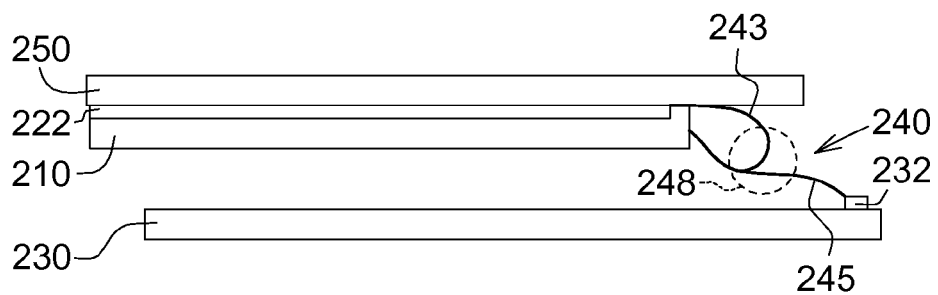
Figure 4:
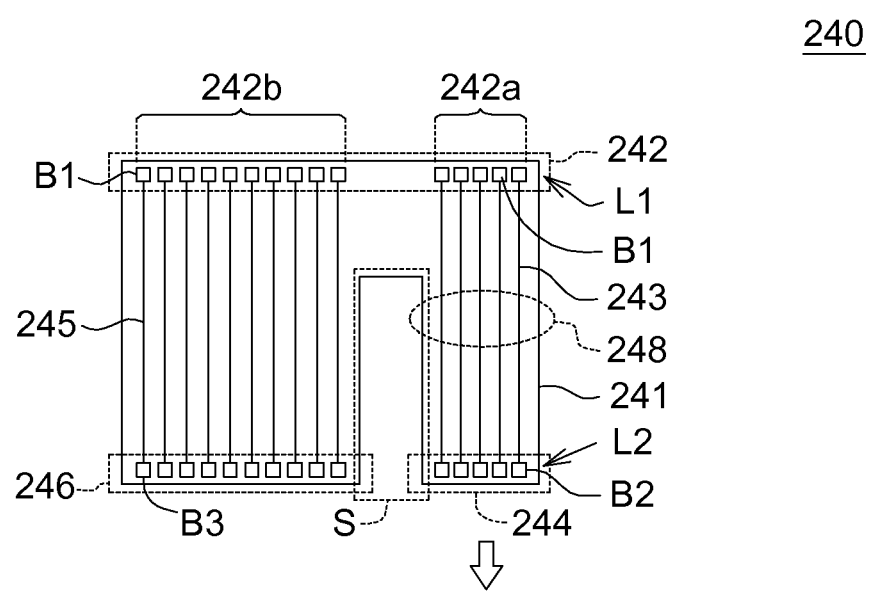
FIG. 4 shows a schematic diagram of a single FPC board for connecting multiple modules according to one embodiment of the invention.

Referring to FIGS. 3A~3C and 4. FIGS. 3A~3C show assembly structural diagrams of a touch sensitive display module according to one embodiment of the invention. FIG. 4 shows a schematic diagram of a single FPC board for connecting multiple modules according to one embodiment of the invention. The touch sensitive display module 200 includes a first module 210, a second module 220, a third module 230 and a single FPC board 240. The single FPC board 240 connects the first module 210, the second module 220 and the third module 230. The first module 210 is such as a display panel. The second module 220, such as a touch panel, is disposed on the first module 210. The third module 230, such as a motherboard, is adjacent to the first module 210. Preferably, the first module 210 is disposed between the second module 220 and the third module 230. In one embodiment, the touch panel can be pasted on a lower surface (as indicated in FIG. 3A) of the cover 250 according to an out cell solution; a touch-sensitive transparent conductive layer 222 (as indicated in FIG. 3B) can be formed on the cover 250 according to a one glass solution; or, the touch-sensitive transparent conductive layer 222 can be integrated onto the display panel or embedded into the display panel (as indicated in FIG. 3C) according to an on cell/in cell solution.

Referring to FIG. 4, the single FPC board 240 has a single thin film 241, which has a first module connecting portion 242, a second module connecting portion 244, a third module connecting portion 246, a folding portion 248 and a slot S. The first module connecting portion 242, such as a display panel connecting portion, has multiple first bonding pads B1 such as golden fingers. Each first bonding pad B1 can be connected to the first module 210 with a conductive glue for transmitting relevant electrical signals. The second module connecting portion 244, such as a touch panel connecting portion, has multiple second bonding pads B2 such as golden fingers. Each second bonding pad B2 can be connected to the second module 220 with a conductive glue for transmitting relevant electrical signals. In addition, the third module connecting portion 246, such as a motherboard connecting portion, has multiple third bonding pads B3 such as golden fingers. Each third bonding pad B3 can be electrically connected to the third module 230 through the connector 232 on the third module 230 for transmitting relevant electrical signals. The third bonding pad B3 can also be electrically connected to the third module 230 through other elements in addition to the connector 232.

Referring to FIG. 4, based on the source of the signal, the first module connecting portion 242 is divided into a first signal connecting portion 242a and a second signal connecting portion 242b which are electrically connected to the first line 243 and the second line 245 respectively. At least one first line 243 is disposed between the first module connecting portion 242 and the second module connecting portion 244 for transmitting a first type signal, such as a touch-sensitive signal, which provides the sensing data of the touch position for the control chip on the display panel to calculate the coordinates of the touch position. In addition, at least one second line 245 is disposed between the first module connecting portion 242 and the third module connecting portion 246 for transmitting a second type signal, such as a display panel driving signal from the third module 230 and a touch position signal calculated by the control chip on the first module 210 to the third module 230, for generating an image on the display panel according to the touch position signal so as to complete touch display operation.

Figure 5A:
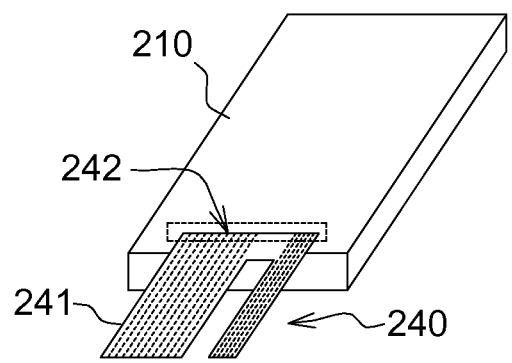
FIGS. 5A~5D respectively show assembly flowcharts of a touch sensitive display module.
Figure 5B:
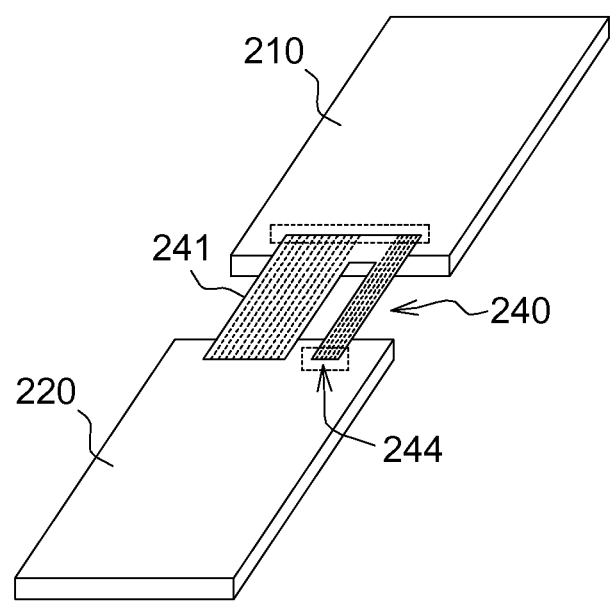
Figure 5C:
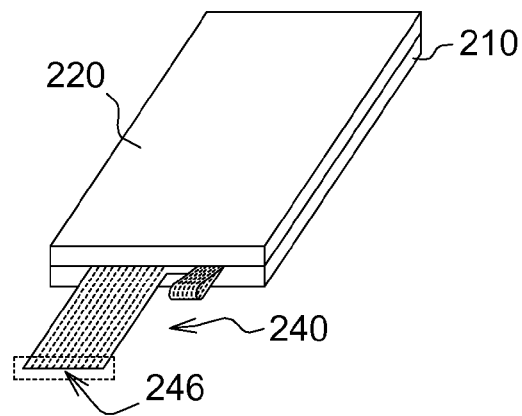
Figure 5D:
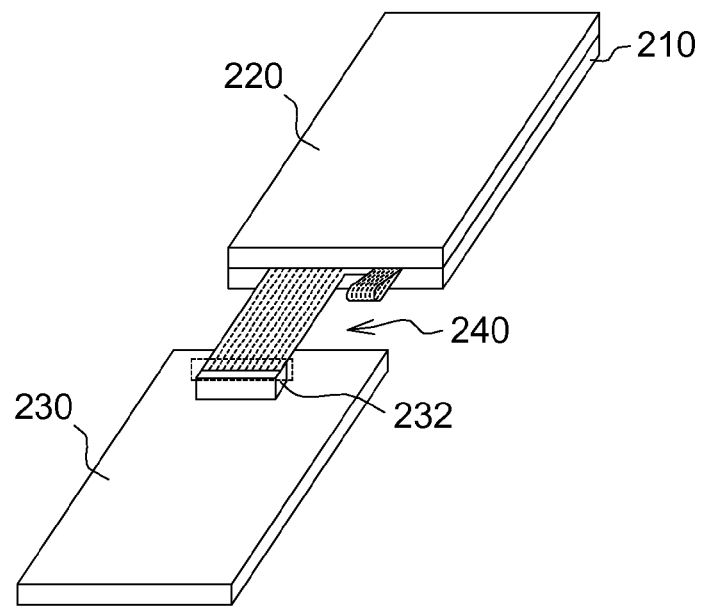

Referring to FIGS. 5A~5D, assembly flowcharts of a touch sensitive display module are respectively shown. As indicated in FIG. 5A, the first module connecting portion 242 located on a first side L1 of the thin film 241 is connected to the first module 210. As indicated in FIG. 5B, the second module connecting portion 244 located on a second side L2 of the thin film 241 is connected to the second module 220. Since the slot S separates the second module connecting portion 244 and the third module connecting portion 246 and the folding portion 248 is located between the first module connecting portion 242 and the second module connecting portion 244, the second module connecting portion 244 can be stacked on a part of the first module connecting portion 242 through the folding design. Meanwhile, the third module connecting portion 246 located on a second side L2 of the thin film 241 is not folded. As indicated in FIG. 5D, the third module connecting portion 246 is connected to the connector 232 of the third module 230. Thus, the assembly procedure for assembling the touch sensitive display module 200 can be completed, and the time required for assembling the multiple modules can be reduced. The above assembly process is merely an embodiment for exemplification purpose, and the invention does not have restrictions with respect to the procedures of the assembly process.

In the above assembly process, the second module 220 does not have to be stacked on the first module 210. The second module 220 can also be stacked under the first module 210 or be separated from the first module 210 for a distance in a vertical direction. Instead of the stacking design, the first module 210 and the second module 220 can be disposed in parallel or separated for a distance in a horizontal direction. In addition, the first bonding pad B1 of the first module connecting portion 242 is not necessarily connected above the first module 210, and can also be connected under the first module 210. The second bonding pad B2 of the second module connecting portion 244 is not necessarily connected under the second module 220, and can also be connected above the second module 220. The third bonding pad B3 of the third module connecting portion 246 is not necessarily connected above the third module 230, and can also be connected under the third module 230. The single FPC board 240 is not limited to a rectangle as indicated in FIG. 4, and can have any other shape. For example, the thin film 241 can be extended towards the second module connecting portion 244, towards the third module connecting portion 246, towards the left side or the right side or the two sides, or towards any combination of the above extending directions for increasing the bendability or application/assembly flexibility of the single FPC board. Besides, the length and width of the slot S can be determined according to the needs of design and application. In the above exemplification, the slot S has a width. However, in practical application, the slot can be formed by cutting a line (i.e., the width can be relatively small, e.g., to nearly zero), the shape and width of the slot can have various designs, and the extending direction can be deflected. According to the needs of design, more slots can be designed for increasing the bendability or application/assembly flexibility of the single FPC board. Thus, the above assembly process can be adjusted or combined according to actual needs, and the invention does not have further restrictions.

Second Embodiment

Figure 6A:
FIGS. 6A~6C respectively show assembly structural diagrams of a touch sensitive display module according to one embodiment of the invention.
Figure 6B:
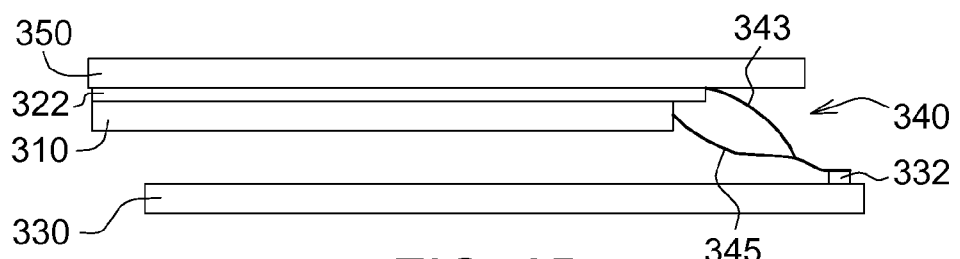
Figure 6C:
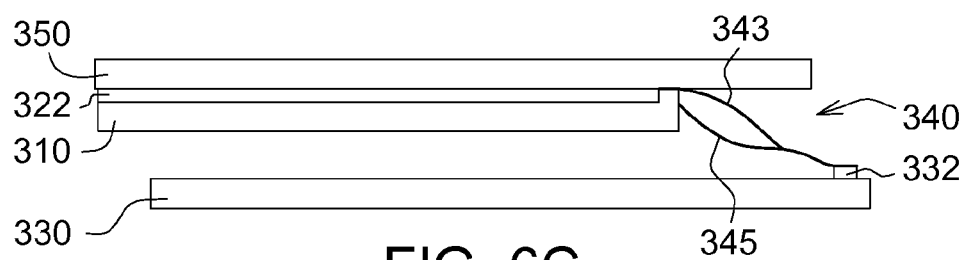
Figure 7A:
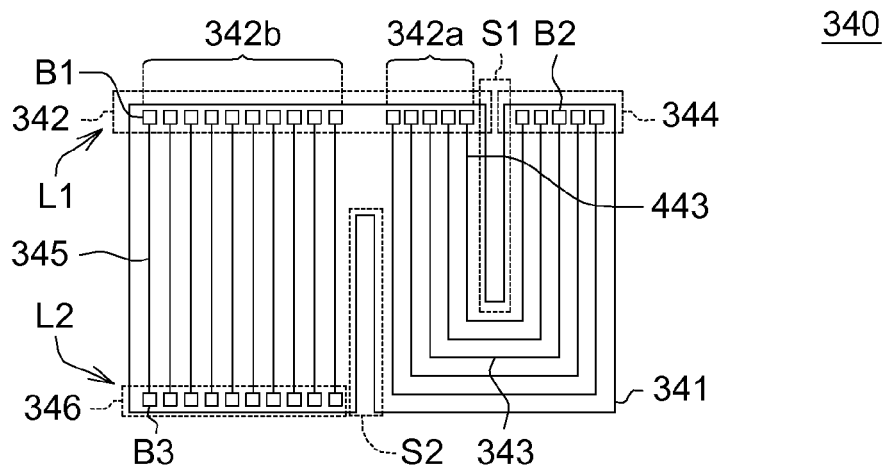
FIGS. 7A and 7B respectively show schematic diagram of a single FPC board for connecting multiple modules according to one embodiment of the invention.
Figure 7B:
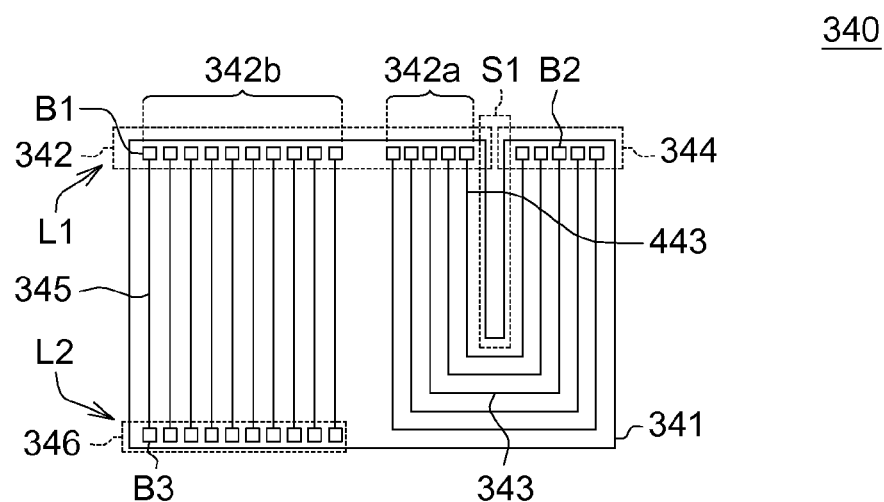

Referring to FIGS. 6A~6C and 7A~7B. FIGS. 6A~6C respectively show assembly structural diagrams of a touch sensitive display module according to one embodiment of the invention. FIGS. 7A and 7B respectively show schematic diagram of a single FPC board for connecting multiple modules according to one embodiment of the invention. The touch sensitive display module 300 includes a first module 310, a second module 320, a third module 330 and a single FPC board 340. The first module 310 is such as a display panel. The second module 320 is such as a touch panel. The third module 330 is such as a motherboard. In one embodiment, the touch panel can be pasted on a lower surface (as indicated in FIG. 6A) of the cover 350 according to an out cell solution; a touch-sensitive transparent conductive layer 322 (as indicated in FIG. 6B) can be formed on the cover 250 according to a one glass solution; or the touch-sensitive transparent conductive layer 322 can be integrated onto the display panel or embedded into the display panel (as indicated in FIG. 6C) according to an on cell/in cell solution.

Referring to FIGS. 7A and 7B. The single FPC board 340 has a single thin film 341. The thin film 341 has a first module connecting portion 342, a second module connecting portion 344, a third module connecting portion 346 and a first slot S1. The first module connecting portion 342, such as a display panel connecting portion, has multiple first bonding pads B1 such as golden fingers. Each first bonding pad B1 can be connected to the first module 310 with a conductive glue for transmitting relevant electrical signals. The second module connecting portion 344, such as a touch panel connecting portion, has multiple second bonding pads B2 such as golden fingers. Each second bonding pad B2 can be connected to the second module 320 with a conductive glue for transmitting relevant electrical signals. In addition, the third module connecting portion 346, such as a motherboard connecting portion, has multiple third bonding pads B3 such as golden fingers. The third bonding pad B3 can be electrically connected to the third module 330 through the connector 332 on the third module 330 for transmitting relevant electrical signals. The third bonding pad B3 can also be electrically connected to the third module 330 through other elements in addition to the connector 332.

Referring to FIGS. 7A and 7B. Based on the source of the signal, the first module connecting portion 342 is divided into a first signal connecting portion 342a and a second signal connecting portion 342b which are electrically connected to the first line 343 and the second line 345 respectively for transmitting different types of signals such as a touch-sensitive signal from the second module 320 and a display panel driving signal/a touch position signal. The details are disclosed in the first embodiment, and the similarities are not repeated here.

The main differences between FIG. 7A and FIG. 7B are as follows: As indicated in FIG. 7A, the thin film 341 further has a second slot S2 located on a second side L2 of the thin film 341, wherein the second slot S2 separates the first line 343 and the second line 345 for increasing the bendability of the thin film 341. The first slot S1 and the second slot S2 are located on different sides of the thin film 341, and the lengths of the two slots are determined according to the needs of application and can thus be the same or different from each other. For example, the lengths of the first slot S1 and the second slot S2 may be about a half of the length of the thin film for increasing the bendability of the thin film 341. Despite the second slot S2 is not illustrated in FIG. 7B, the thin film 341 can be extended towards the second module connecting portion 346 for increasing the bendability of the single FPC board 340.

Figure 8A:
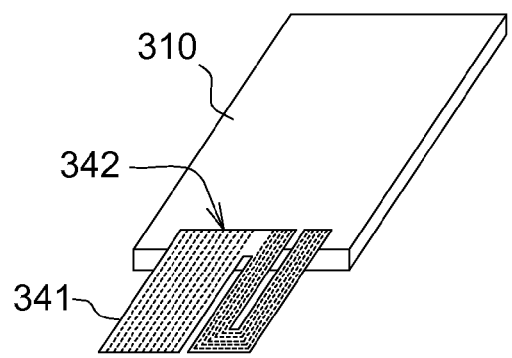
FIGS. 8A~8C respectively show assembly flowcharts of a touch sensitive display module.
Figure 8B:
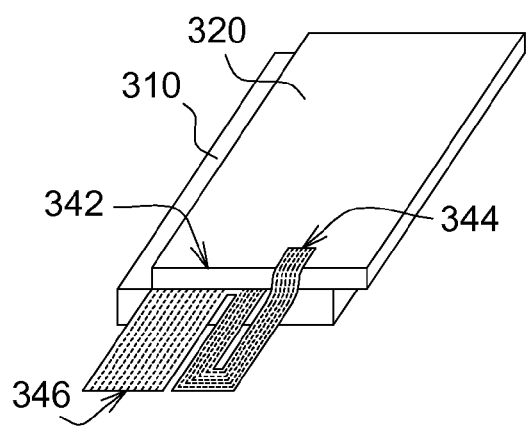
Figure 8C:
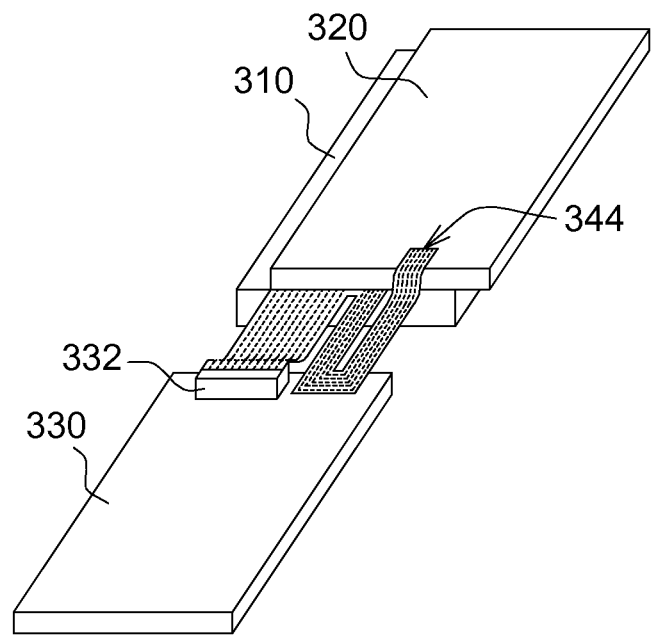

Referring to FIGS. 8A~8C, assembly flowcharts of a touch sensitive display module are respectively shown. FIGS. 8A~8C are exemplified by the single FPC board 340 of FIG. 7A, and the analogy can be applied to the single FPC board 340 of FIG. 7B. As indicated in FIG. 8A, the first module connecting portion 342 located on a first side L1 of the thin film 341 is connected to the first module 310. As indicated in FIG. 8B, the second module connecting portion 344 located on a first side L1 of the thin film 341 is connected to the second module 320. Meanwhile, the second module 320 stacks on the first module 310. Since the first slot S1 separates the first module connecting portion 342 and the second module connecting portion 344, the branch design enables the first module connecting portion 342 and the second module connecting portion 344 to be located on the first module 310 and the second module 320 respectively. As indicated in FIG. 8C, the third module connecting portion 346 located on a second side L2 of the thin film 341 is connected to the connector 332 of the third module 33. Thus, the assembly procedure of the touch sensitive display module 300 can be completed, and the time required for assembling the multiple modules can be reduced. The above assembly process is merely an embodiment for exemplification purpose, and the invention does not have restrictions with respect to the procedures of the assembly process.

In the above assembly process, the second module 320 does not have to be stacked on the first module 310. The second module 320 can also be stacked under the first module 310 or separated from the first module 310 for a distance in a vertical direction. Instead of the stacking design, the first module 310 and the second module 320 can be disposed in parallel or separated for a distance in a horizontal direction. In addition, the first bonding pad B1 of the first module connecting portion 342 is not necessarily connected above the first module 310, and can also be connected under the first module 310. The second bonding pad B2 of the second module connecting portion 344 is not necessarily connected under the second module 320, and can also be connected above the second module 320. The third bonding pad B3 of the third module connecting portion 346 is not necessarily connected above the third module 330, and can also be connected under the third module 330. The single FPC board 340 is not limited to a rectangle as indicated in FIGS. 7A and 7B, and can have any other shape. For example, the thin film 341 can be extended towards the first module connecting portion 342 (342a or 342b or both), towards or opposite to the second module connecting portion 344, towards the third module connecting portion 346, towards the left side or the right side or the two sides, or towards any combination of the above extending directions for increasing the bendability or application/assembly flexibility of the single FPC board. Besides, the length and width of the first slot S1 and the second slot S2 can be determined according to the needs of design and application. In the above exemplification, both the first slot S1 and the second slot S2 have widths. However, in practical applications, the slot can be formed by cutting a line (i.e. the widths of the first slot S1 and the second slot S2 can be relatively small, e.g., to nearly zero), the shape and width of the slot can have various designs, and the extending direction can be deflected. According to the needs of design, more slots can be designed for increasing the bendability or application/assembly flexibility of the single FPC board. Thus, the above assembly process can be adjusted or combined according to actual needs, and the invention does not have further restrictions.

Third Embodiment

Figure 9A:
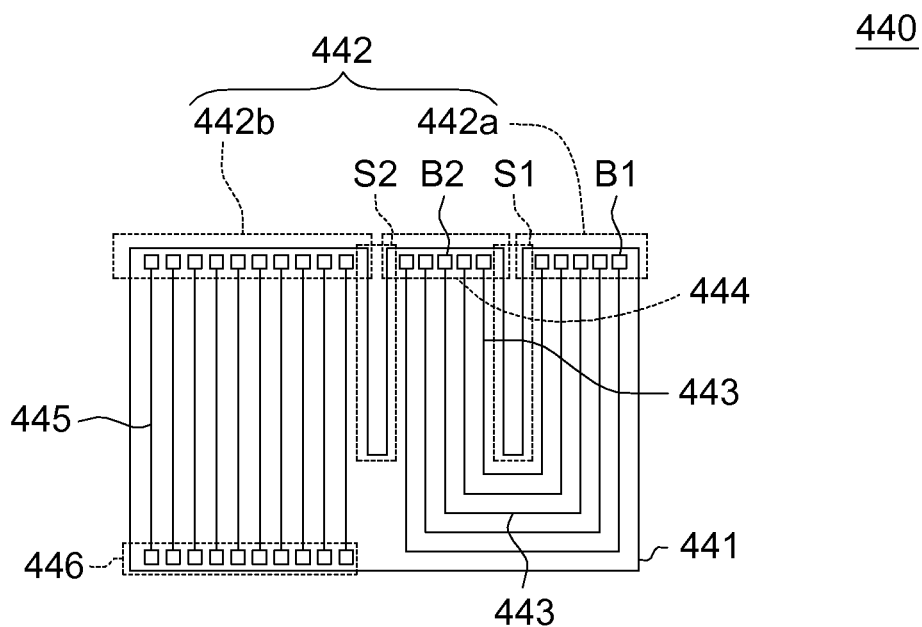
FIGS. 9A~9B respectively show schematic diagrams of a single FPC board for connecting multiple modules according to one embodiment of the invention.
Figure 9B:
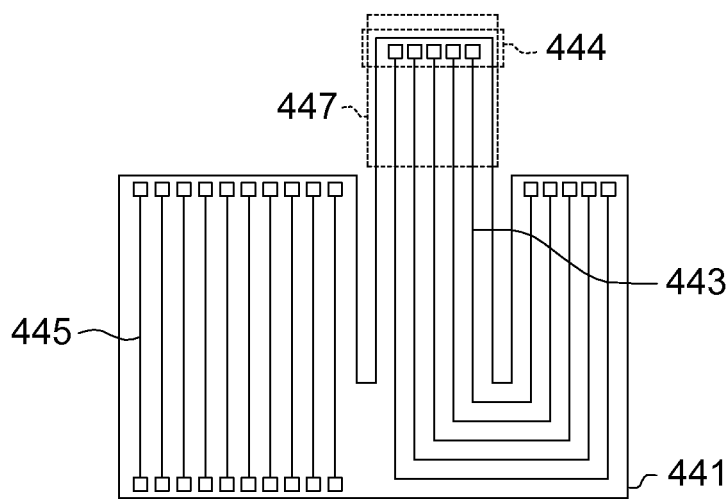

FIGS. 9A~9B respectively show schematic diagrams of a single FPC board for connecting multiple modules according to one embodiment of the invention. The single FPC board 440 has a single thin film 441. The thin film 441 has a first module connecting portion 442, a second module connecting portion 444, a third module connecting portion 446, a first slot S1 and a second slot S2. The present embodiment is similar to the second embodiment, and the main differences are as follows: the first slot S1 and the second slot S2 are located on the same side of the thin film 441, and the second module connecting portion 444 is located between the first slot S1 and the second slot S2.

Based on the source of the signal, the first module connecting portion 442 is divided into a first signal connecting portion 442a and a second signal connecting portion 442b according to the source of the signal. The first slot S1 separates the first signal connecting portion 442a and the second module connecting portion 444. The second slot S2 separates the second signal connecting portion 442b and the second module connecting portion 444. The first signal connecting portion 442a is electrically connected to the first line 443 for transmitting a first type signal such as a touch-sensitive signal. The second signal connecting portion 442b is electrically connected to the second line 445 for transmitting a second type signal such as a display panel driving signal.

The main differences between FIG. 9A and FIG. 9B are as follows: As indicated in FIG. 9B, the second module connecting portion 444 further has an extension portion 447 protruded from the first side L1 of the thin film 441, such that the first line 443 is extended outwards for increasing the bendability of the thin film 441. In addition, the first line 443 can be extended to the left or to the right for a suitable length in cooperation with the size of the thin film 441 so that the second module connecting portion 444 will not be deformed when over-bent and can further be precisely fixed on the second module 220 for increasing the assembly reliability. It is noted that in FIGS. 7A and 7B, the second module connecting portion 344 can adopt similar design and be extended outside the thin film 341. The single FPC board 440 is not limited to a rectangle as indicated in FIGS. 9A and 9B, and can have any other shape. For example, the thin film 441 can be extended towards the first module connecting portion 342 (342a or 342b or both), towards or opposite to the second module connecting portion 344, towards the third module connecting portion 346, towards the left side or the right side or the two sides, or towards any combination of the above extending directions for increasing the bendability or application/assembly flexibility of the single FPC board. Besides, the length and width of the first slot S1 and the second slot S2 can be determined according to the needs of design and application. In the above exemplification, both the first slot S1 and the second slot S2 have widths. However, in practical applications, the slot can be formed by cutting a line (i.e., the widths of the first slot S1 and the second slot S2 can be relatively small, e.g., to nearly zero), the shape and width of the slot can have various designs, and the extending direction can be deflected. According to the needs of design, more slots can be designed for increasing the bendability or application/assembly flexibility of the single FPC board. Relevant assembly structure and assembly process of the touch sensitive display module of FIGS. 9A and 9B can be obtained from the analogy of the second embodiment, and the similarities are not repeated here.

The single FPC board for connecting multiple modules disclosed in above embodiments of the invention adopts the design of single thin film for connecting at least two modules for transmitting relevant electrical signals. Since only one FPC board is used and the lines on the thin film can be electrically connected between the display panel and the touch panel through one FPC board without using extra connector, the assembly procedure can be made more convenient and the time for assembling multiple modules can thus be reduced. The FPC board is formed by a single thin film, and a largest number of thin films can be manufactured if a smallest size is adopted. Therefore, unnecessary wastes can be avoided during the manufacturing process, and the cost can be further reduced.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A single FPC board for connecting multiple modules, comprising:
a thin film having a first module connecting portion, a second module connecting portion and a third module connecting portion, wherein each of the first module connecting portion, the second module connecting portion and the third module connecting portion is located on a first side or a second side of the thin film, and the first side is opposite to the second side, wherein the first to the third module connecting portions are a display panel connecting portion, a touch panel connecting portion and a motherboard connecting portion, respectively;
at least one first line disposed between the first module connecting portion and the second module connecting portion; and
at least one second line disposed between the first module connecting portion and the third module connecting portion,
wherein the first module connecting portion is located on the first side of the thin film, and the first module connecting portion is divided into a first signal connecting portion and a second signal connecting portion, which are electrically connected to the at least one first line and the at least one second line respectively,
wherein the second module connecting portion and the third module connecting portion are located on the second side of the thin film, the second module connecting portion is electrically connected to the first signal connecting portion through the at least one first line, and the third module connecting portion is electrically connected to the second signal connecting portion through the at least one second line, and
wherein the thin film further has a slot extended inward into the thin film from the second side of the thin film to separate the second module connecting portion and the third module connecting portion.

2. The single FPC board according to claim 1, wherein the thin film further has a folding portion located between the first signal connecting portion of the first module connecting portion and the second module connecting portion.

3. A touch sensitive display module, comprising:
a first to a third module; and
the single FPC board according to claim 1, wherein the first to the third module connecting portions are connected to the first to the third modules, respectively.

4. The touch sensitive display module according to claim 3, wherein the second and the third module are located on top and bottom sides of the first module, respectively.

5. A touch sensitive display module, comprising:
a first module;
a second module disposed on the first module;

a third module adjacent to the first module, wherein the first module is located between the second module and the third module, wherein the first module is a display panel, the second module is a touch panel, and the third module is a motherboard; and a single FPC board connecting the first module, the second module and the third module, comprising:

a thin film having a first module connecting portion, a second module connecting portion and a third module connecting portion, wherein each of the first module connecting portion, the second module connecting portion and the third module connecting portion is located on a first side or a second side of the thin film, and the first side is opposite to the second side;

at least one first line disposed between the first module connecting portion and the second module connecting portion; and at least one second line disposed between the first module connecting portion and the third module connecting portion, wherein the first module connecting portion is located on the first side of the thin film, and the first module connecting portion is divided into a first signal connecting portion and a second signal connecting portion, which are electrically connected to the at least one first line and the at least one second line respectively, wherein the second module connecting portion and the third module connecting portion are located on the second side of the thin film, the second module connecting portion is electrically connected to the first signal connecting portion through the at least one first line, and the third module connecting portion is electrically connected to the second signal connecting portion through the at least one second line, wherein the thin film further has a slot extended inward into the thin film from the second side of the thin film to separate the second module connecting portion and the third module connecting portion.

6. The single FPC board according to claim 5, wherein the thin film further has a folding portion located between the first signal connecting portion of the first module connecting portion and the second module connecting portion.

7. A single FPC board for connecting multiple modules, comprising:

a thin film having a first module connecting portion, a second module connecting portion and a third module connecting portion, wherein each of the first module connecting portion, the second module connecting portion and the third module connecting portion is located on a first side or a second side of the thin film, and the first side is opposite to the second side, wherein the first to the third module connecting portions are a display panel connecting portion, a touch panel connecting portion and a motherboard connecting portion, respectively;

at least one first line disposed between the first module connecting portion and the second module connecting portion; and at least one second line disposed between the first module connecting portion and the third module connecting portion, wherein the first module connecting portion and the second module connecting portion are located on the first side of the thin film, and the first module connecting portion is divided into a first signal connecting portion and a second signal connecting portion, and the second module connecting portion is electrically connected to the first signal connecting portion through the at least one first line, the third module connecting portion is located on the second side of the thin film, and the third module connecting portion is electrically connected to the second signal connecting portion through the at least one second line, the thin film further has a first slot on the first side for separating the first module connecting portion and the second module connecting portion, and a second slot located on the first or second side of the thin film for separating the at least one first line and the at least one second line.

8. The single FPC board according to claim 7, wherein each of the first slot and the second slot is extended inward into the thin film from the first side of the thin film.

9. The single FPC board according to claim 7, wherein the first slot is extended inward into the thin film from the first side of the thin film, and the second slot is extended inward into the thin film from the second side of the thin film.

10. A touch sensitive display module, comprising:
a first to a third module; and
the single FPC board according to claim 7, wherein the first to the third module connecting portions are connected to the first to the third modules, respectively.

11. The touch sensitive display module according to claim 10, wherein the second and the third module are located on top and bottom sides of the first module, respectively.

12. A touch sensitive display module, comprising:
a first module;
a second module disposed on the first module;
a third module adjacent to the first module, wherein the first module is located between the second module and the third module, wherein the first module is a display panel, the second module is a touch panel, and the third module is a motherboard; and a single FPC board connecting the first module, the second module and the third module, the FPC board comprising:

a thin film having a first module connecting portion, a second module connecting portion and a third module connecting portion, wherein each of the first module connecting portion, the second module connecting portion and the third module connecting portion is located on a first side or a second side of the thin film, and the first side is opposite to the second side, wherein the first to the third module connecting portions are a display panel connecting portion, a touch panel connecting portion and a motherboard connecting portion, respectively;

at least one first line disposed between the first module connecting portion and the second module connecting portion; and at least one second line disposed between the first module connecting portion and the third module connecting portion, wherein the first module connecting portion and the second module connecting portion are located on the first side of the thin film, and the first module connecting portion is divided into a first signal connecting portion and a second signal connecting portion, and the second module connecting portion is electrically connected to the first signal connecting portion through the at least one first line, wherein the third module connecting portion are located on the second side of the thin film, and the third module connecting portion is electrically connected to the second signal connecting portion through the at least one second line, and wherein the thin film further has a first slot on the first side for separating the first module connecting portion and the second module connecting portion, and a second slot located on the first or second side of the thin film for separating the at least one first line and the at least one second line.

13. The touch sensitive display module according to claim 12, wherein each of the first slot and the second slot is extended inward into the thin film from the first side of the thin film.

14. The touch sensitive display module according to claim 12, wherein the first slot is extended inward into the thin film from the first side of the thin film, and the second slot is extended inward into the thin film from the second side of the thin film.

* * * * *